(12) United States Patent
Jacot et al.

(10) Patent No.: US 6,566,274 B1
(45) Date of Patent: May 20, 2003

(54) LITHOGRAPHY PROCESS FOR TRANSPARENT SUBSTRATES

(75) Inventors: Philippe Jacot, St-Aubin (CH); Hubert Choffat, Boole (CH)

(73) Assignee: Unaxis Balzer Limited (LI)

( * ) Notice: Subject to any disclaimer, the term of this patent is extended or adjusted under 35 U.S.C. 154(b) by 0 days.

(21) Appl. No.: 09/996,545

(22) Filed: Nov. 28, 2001

(51) Int. Cl.$^7$ ............................................. H01L 21/302
(52) U.S. Cl. ........................ 438/739; 438/689; 438/750; 430/20; 430/290; 430/296; 430/310; 430/311; 430/312; 430/313; 430/314; 430/317
(58) Field of Search ................................ 438/689, 739, 438/750; 430/20, 290, 296, 310, 311, 312, 313, 314, 317

(56) References Cited

U.S. PATENT DOCUMENTS

| | | | |
|---|---|---|---|
| 5,468,595 A | 11/1995 | Livesay | 430/296 |
| 5,994,007 A | * 11/1999 | Sato et al. | 430/22 |

OTHER PUBLICATIONS

W.R. Livesay, "Vertical Lithography—controlling resist profiles in optical lithography with a large area electron beam, " SPIE Microlithography Conference, 1994.

* cited by examiner

Primary Examiner—Ernest Karlsen
Assistant Examiner—Lisa Kilday
(74) Attorney, Agent, or Firm—Cahill, von Hellens & Glazer P.L.C.

(57) ABSTRACT

A method of creating an undercut sidewall profile within an opening formed in a positive resist layer disposed upon a transparent substrate includes the step of forming a positive resist layer on the upper surface of the substrate, and optically patterning the resist layer by selectively directing light at the resist layer from above the upper surface of the substrate. The lower surface of the substrate is flooded with light to partially expose the lowermost region of the resist layer, and the exposed resist is dissolved to form patterned openings therein. The resulting sidewalls of the patterned resist openings have an enlarged width adjacent the upper surface of the substrate. The sidewalls of the resist layer are then flooded with light from above the substrate, the upper region of the resist layer is cured by an electron beam, and the resist layer is developed a second time to dissolve exposed portions of the resist sidewalls, thereby forming an undercut resist sidewall profile.

15 Claims, 4 Drawing Sheets

LITHOGRAPHY PROCESS FOR TRANSPARENT SUBSTRATES

BACKGROUND OF THE INVENTION

1. Field of the Invention

The present invention relates generally to photolithography methods for fabricating semiconductor wafers and other microsystems devices, and more particularly, to an improved method for controlling pattern edge profiles, and forming undercut openings, in photoresist layers applied to transparent wafer substrates.

2. Description of the Relevant Art

The art of photolithography in the fine patterning of semiconductor and other substrates is well known. Examples of applications for photolithography are the formation of integrated circuits, magnetic recording heads or other Micro Electro-Mechanical Systems (MEMS) devices. In conventional pattern forming processes, a substrate is coated with a layer of material that is sensitive to some form of electromagnetic radiation, including optical radiation, X-ray, ions and/or electron radiation. This material is usually called photoresist or polymide. Those portions of the resist layer that are exposed to such radiation undergo a change relative to solubility by a specific solvent, or developer. Accordingly, desired patterns can be formed within the resist layer as a result of the differential solubility-between the irradiated and non-irradiated regions of the photoresist layer.

The above-described solubility changes are produced by either bond-breaking (chain scission) or bond formation (chain cross-linking) in a polymeric resist. A positive-acting resist will become more soluble, via chain scission, when irradiated; accordingly, when using a positive resist, the resist material remaining after exposure and development of the resist corresponds to the opaque (non-transmissive) portion of the mask used to selectively pattern the resist. In contrast, a negative resist will cross-link, and become more insoluble, when irradiated; accordingly, when using a negative resist, the resist material remaining after exposure and development of the resist corresponds to the transparent (transmissive) portion of the mask used to selectively pattern the resist.

Of course, the whole point of creating a patterned resist layer is to be able to accurately transfer the pattern defined in the resist layer to another layer of material in or on the substrate. For example, it may be desired to chemically etch openings within an insulative layer of silicon dioxide formed upon a silicon wafer, and in this instance, the polymeric resist can shield portions of the silicon dioxide layer from the chemical etchant. As a second example, it may be desired to pattern a metal interconnect layer formed upon a semiconductor wafer, and in this case, the polymeric resist can protect covered portions of the metallic layer from being stripped away.

There are many different kinds of pattern transfer processes which can be additive or subtractive in nature. Subtractive techniques involve an etching away of material using, for example, a dry plasma, a chemical solution, or ion beam exposure. Additive processes are those where material is deposited, for example, via evaporation, electroplating or ion implantation, after the resist has been patterned. In an additive, or so-called "lift-off process", an added layer is deposited through the resist openings onto the substrate after resist patterning; then the resist is stripped off, leaving only the deposited layer in the regions where openings had been formed in the resist layer.

When the aforementioned additive lift-off process is used to deposit a metal layer onto a substrate, an undercut resist profile is desired to effect a clean discontinuity of the deposited metal layer. Such an undercut resist profile can be achieved by using a positive resist, and by patterning such positive resist layer using an electron beam. For example, in U.S. Pat. No. 5,468,595 issued to Livesay, two electron beam exposure methods are described wherein the electron beam is used to vary the solubility properties of the resist material depending upon the depth of the resist material, i.e., depending upon how close the region of the resist material lies to the upper surface of the substrate. By exposing the lower region of the positive resist layer to a greater dosage of the electron beam, as compared with a lesser dosage of the electron beam used to expose the upper region of the positive resist layer, the lower region of resist can be made more soluble, resulting in the formation of undercut openings in the resist layer (see Livesay '595, column 6, lines 22–51). In the second method, it has been found that solubility reaches a maximum at a particular dosage, and that further increases in electron beam dosage actually cause solubility to decrease. In these cases, the upper region can be made less soluble than the lower region by using a higher electron beam dosage for the upper region (see Livesay '595, column 8, lines 35–68 and column 9, lines 1–17).

One significant drawback of the process described in the '595 Livesay patent is the creation of undesired "feet" within the base portion of the patterned resist openings. The reasons for the creation of such "feet" are demonstrated in Prior Art FIGS. 1–4. As shown in Prior Art FIG. 1, a substrate 20 is coated with a positive resist layer 22 and exposed by a patterned Ultraviolet light 24 (using a wafer stepper, mask aligner, or holographic exposure machine) to a desired exposure level. The exposed resist layer is then developed using a positive resist developer, resulting in the structure shown in FIG. 2, including resist opening 26. In an ideal process, the resist profile of opening 26 would exhibit sidewalls 28 that remain perfectly vertical down to substrate 20. In practice, however, when resist layer 22 is being developed, sidewalls 28 actually extend at an angle in the 85 to 90 degree range relative to the surface of substrate 20, and exhibit some radius at their feet 30.

The structure shown in Prior Art FIG. 2 is thereafter exposed to a lower-level dosage electron beam (not shown) to adjust the relative solubilities of the upper and lower regions of the resist layer. Then, as shown in Prior Art FIG. 3, and in anticipation of producing an undercut resist opening, a high dosage, low accelerating voltage, electron beam 32 is applied to the structure to render the top region 34 of resist layer 22 unsoluble. However, feet 30 are also exposed to such electron beam, and therefore become relatively unsoluble, as well; this remains true even if the structure is thereafter subjected to exposure by a lower dose, higher accelerating voltage, electron beam used to render the rest of the resist layer soluble. This problem is mentioned in the Livesay '595 patent at column 9, lines 54–64. Following the second resist development step, the unsoluble radius feet 30 remain, as shown in FIG. 4. These feet present an unacceptable fault for purposes of using such undercut resist openings to form a patterned layer upon substrate 20 using the above-described lift-off process.

Accordingly, it is an object of the present invention to provide a method of creating undercut openings in a positive resist layer upon a substrate to facilitate patterned deposition of metal layers upon such substrate using a metal lift-off process while suppressing the formation of feet within such undercut openings.

Another object of the present invention is to decrease the sensitivity of such undercut resist opening fabrication technique to the non-uniformity of large-area electron beam equipment used to expose such resist layers.

Still another object of the present invention is to simplify the aforementioned multiple low-dose exposure step, used to selectively vary the solubility of different resist regions, especially when relatively thick photoresist is used.

A further object of the present invention is to reduce unwanted cross-linking on sidewall surfaces of the resist layer, and to improve overhang control by maintaining the lateral dissolution rate of the resist more constant.

Yet another object of the present invention is to provide such a method which does not require the use of multi-acceleration, low dosage electron beam exposure in order to vary the solubility of resist layers at different depths.

These and other objects of the present invention will become more apparent to those skilled in the art as the description of the present invention proceeds.

SUMMARY OF THE INVENTION

Briefly described, and in accordance with a preferred embodiment thereof, the present invention relates to a method of creating an undercut resist sidewall profile within an opening formed in a positive resist layer disposed upon a substrate that is relatively transparent. The method includes the steps of forming a positive resist layer upon the upper surface of the transparent substrate, and optically patterning the resist layer, as by selectively directing light through a mask at the resist layer in an area where an opening is to be formed. The lower surface of the transparent substrate is flooded with light to partially expose the lowermost region of the resist layer lying closest to the substrate; this flooding step can be performed either before or after the optical patterning step. Thereafter, the resist layer is developed a first time by dissolving exposed resist to form a patterned opening therein. Such opening has an increased width within the lowermost region of the resist layer adjacent the substrate because of the above-mentioned exposure of the lowermost region of the resist layer via the lower surface of the transparent substrate.

In the preferred embodiment of the present invention, the resulting structure is then flooded from above with light, a low dosage electron beam, or other electromagnetic radiation to expose all the remaining photoresist in order to increase the solubility rate of the resist exposed thereto, particularly including the exposed sidewalls of the resist layer opening. Assuming that light is used to flood the resist layer from above, then the amount of light applied when flooding from above is preferably greater than the amount of light applied to flood the lowermost region of the resist layer before the first development step. The upper surface of the resist layer is then cured by exposure to a high dosage, low voltage (i.e., 30 KV or less) electron beam, deep ultraviolet light, or the like, to render such exposed regions relatively insoluble. Such electron beam or deep ultraviolet light is applied at a dosage sufficient to cause the uppermost region of the resist layer to become cross-linked. A second development step is then performed to dissolve exposed portions of the sidewalls of the patterned opening, except for the cured uppermost region of the positive resist layer, to form an undercut resist sidewall profile.

When using the aforementioned method as part of a metal lift-off process to form a patterned metal layer upon the substrate, a layer of metal is deposited over the patterned resist layer, and over exposed portions of the substrate. The resist layer is then stripped off the upper surface of the substrate, leaving the patterned metal layer on the surface of the substrate.

DETAILED DESCRIPTION OF THE PREFERRED EMBODIMENT

Figure 1:
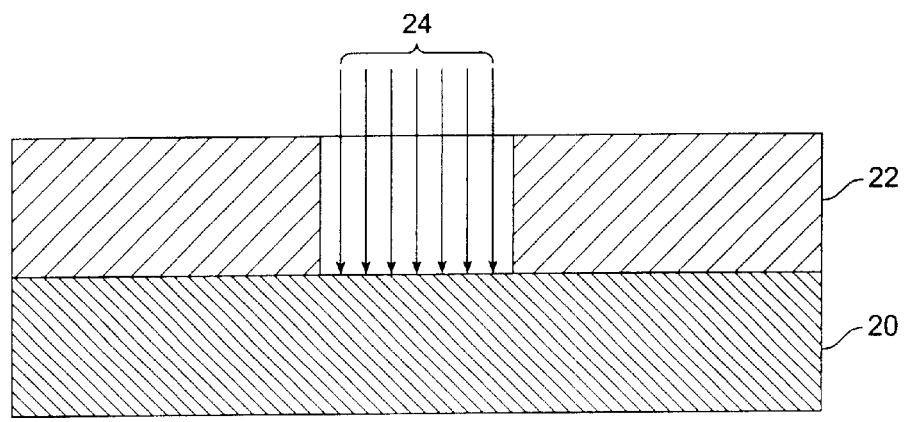
FIGS. 1, 2, 3 and 4 are cross-sectional drawings illustrating a prior art lithography process used to produce undercut resist openings upon the surface of a substrate.
Figure 2:
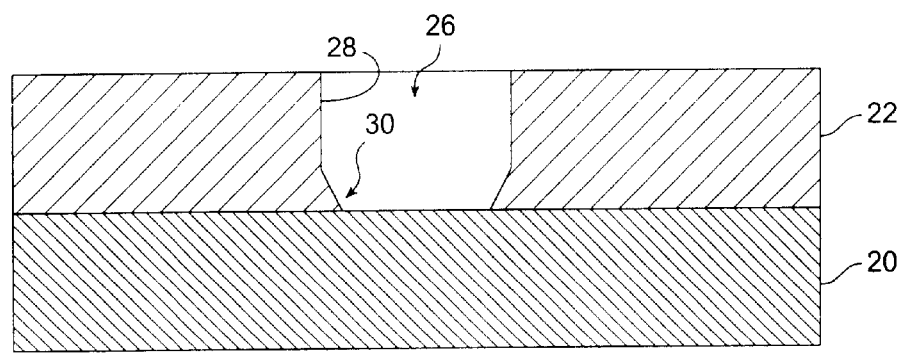
Figure 3:
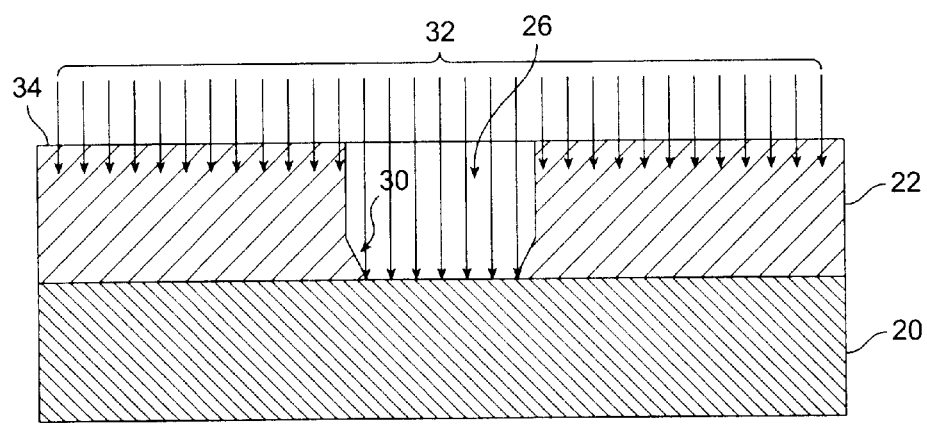
Figure 4:
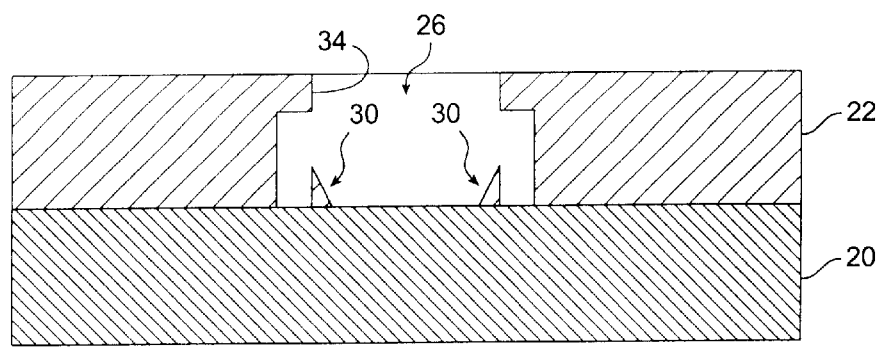
Figure 5:
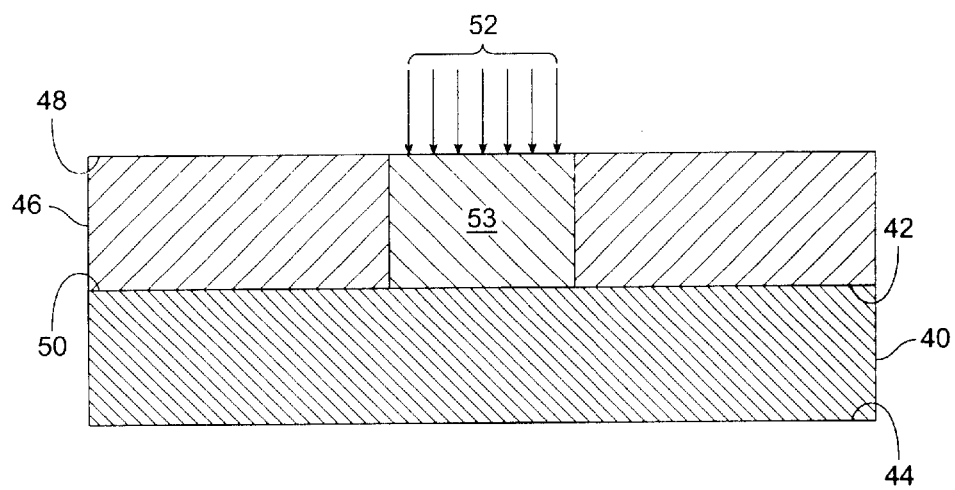
FIG. 5 is a cross-sectional drawing of a transparent substrate upon which a positive resist layer has been formed, and which illustrates a patterned optical light being directed at the resist layer to create an opening therein.

The method for creating an undercut resist sidewall profile within an opening formed in a positive resist layer disposed upon a transparent substrate is best explained in conjunction with FIGS. 5–10 of the drawings accompanying this application. With reference to FIG. 5, a transparent substrate 40 has opposing upper and lower surfaces 42 and 44, respectively. Such a transparent substrate might be formed of quartz, lithium niobate, or lithium tantalate, by way of example. A positive resist layer 46 is formed upon upper surface 42 of transparent substrate 40 using conventional resist application techniques. Positive resist layer 46 includes an uppermost region 48 furthest from substrate 40, and a lowermost region 50 closest to substrate 40.

Figure 6:
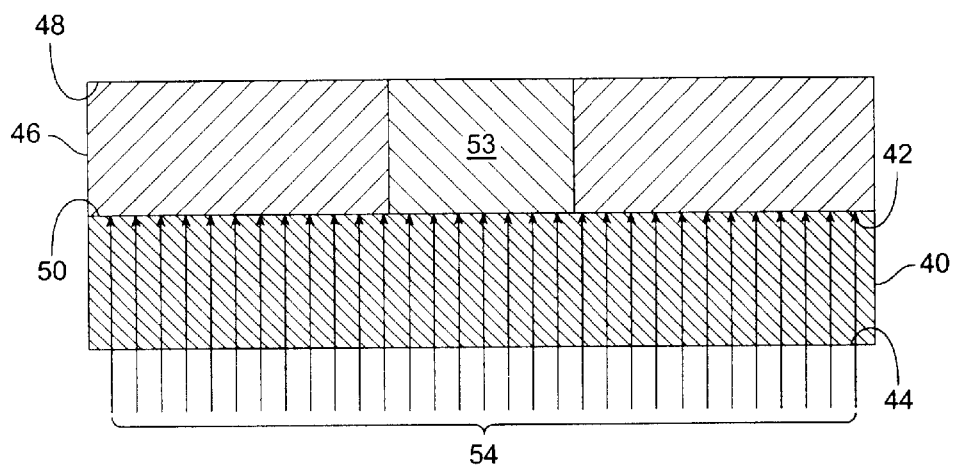
FIG. 6 is a cross-sectional drawing of the transparent substrate shown in FIG. 5 wherein the lower surface (or back face) of the substrate is flooded with light exposed to the lowermost regions of the resist layer.

As a first step toward forming a patterned opening in resist layer 46, an optical pattern of light 52 is selectively directed at resist layer 46 from above upper surface 42 of substrate 40 over the area where an opening is to be formed. This optical pattern of light may be produced by directing a beam of light through a patterned mask, for example, using a conventional wafer stepper, mask aligner, holographic exposure machine, or the like. The exposed region of resist layer 46 is designated by reference numeral 53. Either before, or after, the optical patterning step shown in FIG. 5, the lower surface 44 of transparent substrate 40 is flooded with light 54 to partially expose lowermost region 50 of resist layer 46. As shown in FIG. 6, light 54 reaches lowermost region 50 of resist layer 46 because substrate 40 is transparent to such light. Light 54 essentially modifies the latent image formed by light 52 (see FIG. 5) at lowermost region 50 of resist layer 46, leading to the suppression of the foot problem after development.

Next, a first development step is performed by applying a solvent to dissolve exposed resist region 53 to form patterned opening 56 in resist layer 46. Opening 56 has sidewalls 58 and 60. It will be noted that opening 56 has an enlarged width 62 within the lowermost region 50 of resist layer 46 adjacent substrate 40. This enlarged width results from the extra optical exposure received by lowermost region 50 of resist layer 46 during the back face optical flooding step illustrated in FIG. 6.

Figure 7:
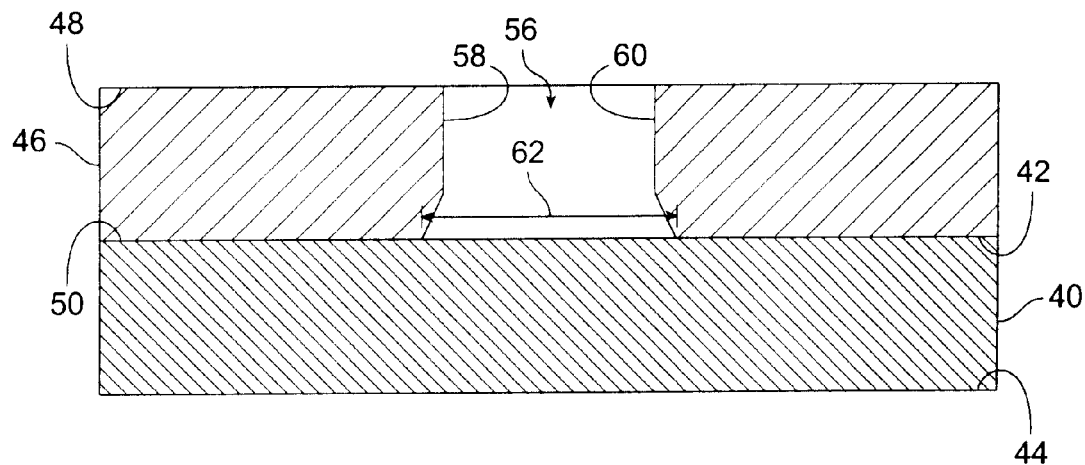
FIG. 7 is a cross-sectional drawing of the transparent substrate shown in FIGS. 5 and 6 following a first development cycle of the resist layer.
Figure 8:
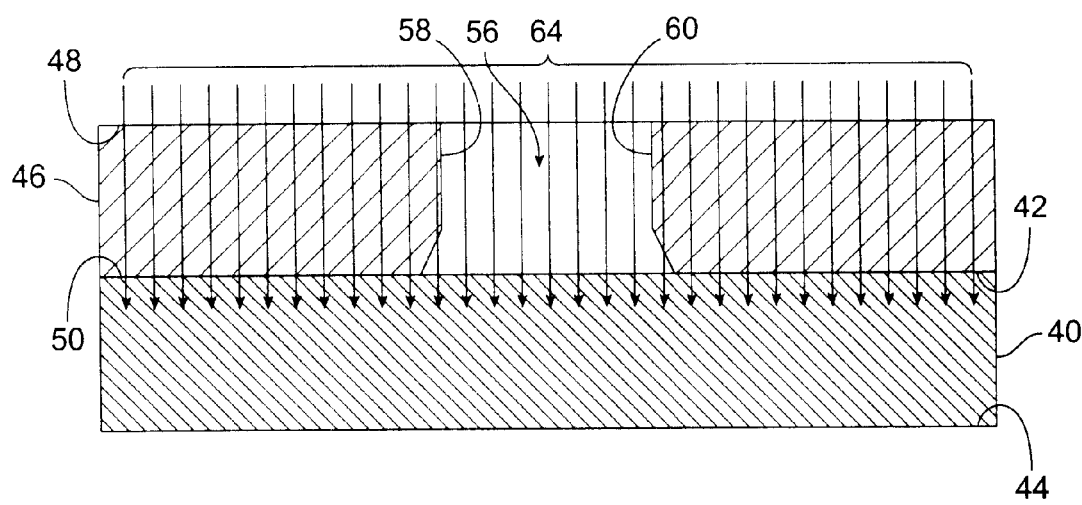
FIG. 8 is a cross-sectional drawing of the transparent substrate shown in FIGS. 5, 6 and 7 during a subsequent high-dosage optical flood exposure step to enhance the solubility of the sidewall regions of the opening shown in FIG. 7.

In order to create an undercut in opening 56, the structure shown in FIG. 7, including uppermost region 48, and opening 56, of resist layer 46 is then flooded with a high dosage of optical light 64 from above upper surface 42 of substrate 40, as shown in FIG. 8, to expose all of the remaining photoresist. This step tends to make exposed regions of resist layer 46 more soluble during a second resist development cycle described below, and makes the development rate of opening 56 more stable. It should be appreciated that the amount of light 64 applied in the flooding step illustrated in FIG. 8 is greater than the amount of light applied from below substrate 40 in the flooding step illustrated in FIG. 6. Moreover, while the radiation described in conjunction with FIG. 8 has been described as being optical light, those skilled in the art will appreciate that this flooding step could also be performed using an electron beam or other forms of radiation.

It is desired that the uppermost region 48 of resist layer 46 "overhang" the final undercut opening formed in the resist layer. Accordingly, the structure of FIG. 8 is subjected to a further electron beam curing step illustrated in FIG. 9. Within FIG. 9, a high dosage, low-voltage (30 KV or less) electron beam 66 is directed at the uppermost region 48 of resist layer 46 to cure uppermost region 48. Due to the enlarged width 62 (see FIG. 7) of opening 56, electron beam 66 does not strike any radius, or "feet", in the bottom of opening 56; thus, no portion of the sidewalls 58 or 60 are cured by electron beam 66. While this curing step is preferably performed using an electron beam, those skilled in the art will appreciate that other forms of radiation, such as deep ultraviolet light, may also be used to cure intercepted portions of resist layer 46. Irrespective of the form of such radiation used, the dosage is selected to be sufficient to cause uppermost region 48 of resist layer 46 to become cross-linked.

Figure 9:
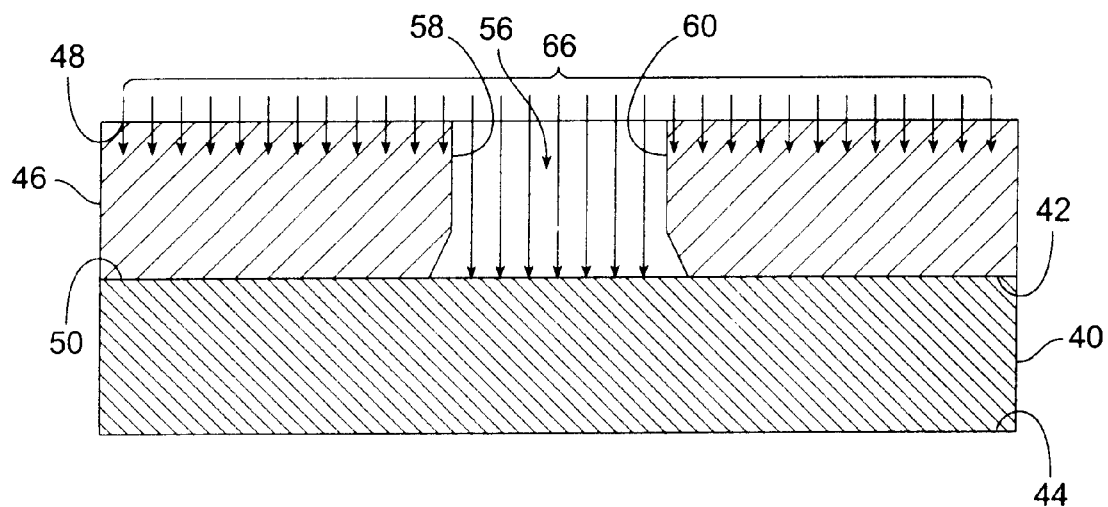
FIG. 9 is a cross-sectional drawing of the transparent substrate shown in FIGS. 5, 6, 7 and 8 during an electron beam curing step used to cure/cross-link the uppermost region of the resist layer.
Figure 10:
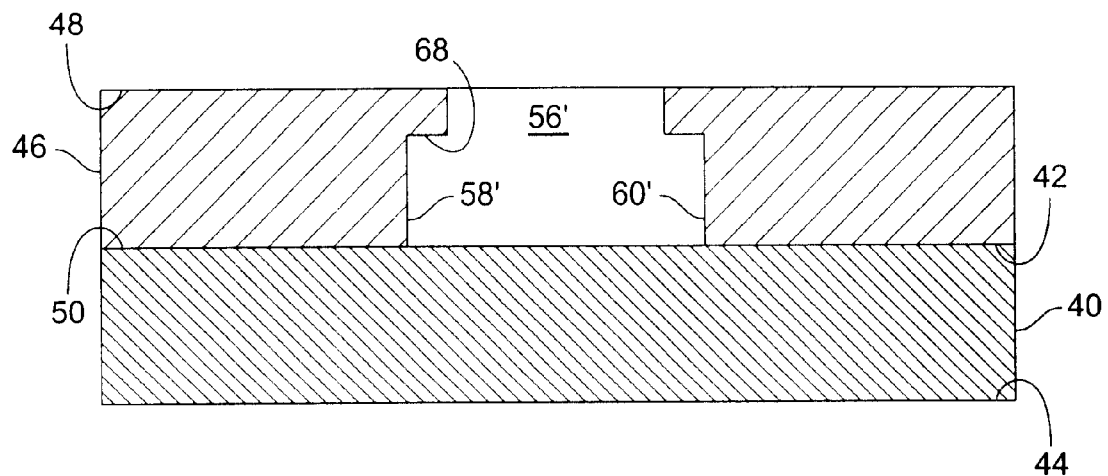
FIG. 10 is a cross-sectional drawing of the transparent substrate shown in FIGS. 5, 6, 7, 8 and 9 following a second development cycle, and illustrating the resulting undercut opening in the resist layer.

After the curing step illustrated in FIG. 9, a second resist development cycle is performed, resulting in the structure shown in FIG. 10. During the second development cycle, the regions of resist layer 46 that were exposed during the flooding operation of FIG. 8 are dissolved, with the exception of the cured uppermost region 48. As a result, opening 56' of FIG. 10 is of greater overall width as compared with the width of opening 56 prior to the second development cycle, but the width of opening 56' at the uppermost region 48 of resist layer 46 does not change because of the curing step performed in FIG. 9. This results in "overhang" 68, shown in FIG. 10, extending above the undercut resist sidewall profile defining opening 56'. Those skilled in the art will appreciate that the developer concentration used to perform this second resist development cycle may differ from that used to perform the first development step mentioned above to adapt the development rate to a suitable value.

Using the method described above, a metal lift-off process can be performed by forming a layer of metal over resist layer 46 of FIG. 10, and over exposed portions of substrate 40 within openings 56'. The resist layer 46 is then stripped off of upper surface 42 of substrate 40 to leave in place a patterned metal layer.

Those skilled in the art will now appreciate that an improved lithography method has been described for use with transparent substrates, and which provides defect-free, highly-controllable, undercut resist profiles for metal lift-off applications on transparent substrates. By taking advantage of the transparency of certain substrates, the resist layer can be exposed from the backside of the substrate in a manner which avoids the footing problem created by the prior art. The described method allows for a robust production process for the fabrication of undercut photoresist profiles, particularly as it is much less sensitive to process variation of the large-area electron beam source, and less sensitive to resist solubility variation. While the present invention has been described with respect to preferred embodiments thereof, such description is for illustrative purposes only, and is not to be construed as limiting the scope of the invention. Various modifications and changes may be made to the described embodiments by those skilled in the art without departing from the true spirit and scope of the invention as defined by the appended claims.

We claim:

1. A method of creating an undercut resist sidewall profile within an opening formed in a positive resist layer disposed upon a transparent substrate, the method comprising the steps of:

a. providing a transparent substrate having upper and lower surfaces;

b. forming a positive resist layer upon the upper surface of the transparent substrate, the positive resist layer including an uppermost region furthest from the substrate, and including a lowermost region closest to the substrate;

c. optically patterning the resist layer by selectively directing light at the resist layer from above the upper surface of the transparent substrate in an area where an opening is to be formed;

d. flooding the lower surface of the transparent substrate with light to partially expose the lowermost region of the positive resist layer; and e. developing, following steps c and d, the resist layer a first time by dissolving exposed resist to form at least one patterned opening in the resist layer, the patterned opening having sidewalls, the patterned opening having an enlarged width within the lowermost region of the resist layer adjacent the substrate, due to step d., as compared with the width of such patterned opening within the uppermost region of the resist layer furthest from the substrate.

2. The method recited by claim 1 including the further steps of:

f. flooding, following step e., the resist layer with a first form of electromagnetic radiation from above the upper surface of the substrate to expose all the remaining photoresist;

g. exposing, following step f., the resist layer to second form of electromagnetic radiation directed at the upper surface of the substrate to cure the uppermost region of the positive resist layer; and h. developing, following step g., the resist layer a second time to dissolve exposed portions of the sidewalls of the patterned opening, except for the cured uppermost region of the positive resist layer, to form an undercut resist sidewall profile.

3. The method recited by claim 1 wherein optical patterning step c. is performed before flooding step d.

4. The method recited by claim 1 wherein optical patterning step c. is performed after flooding step d.

5. The method recited by claim 1 wherein optical patterning step c. includes the step of directing light through a mask toward the resist layer.

6. The method recited by claim 2 wherein the first form of electromagnetic radiation applied in flooding step f. is an electron beam.

7. The method recited by claim 2 wherein the first form of electromagnetic radiation applied in flooding step f. is light.

8. The method recited by claim 7 wherein the amount of light applied in flooding step f. is greater than the amount of light applied in flooding step d.

9. The method recited by claim 2 wherein the second form of electromagnetic radiation applied in exposing step g. is deep ultraviolet light.

10. The method recited by claim 9 wherein the deep ultraviolet light is applied in exposing step g. at a dosage sufficient to cause the uppermost region of the resist layer to become cross-linked.

11. The method recited by claim 2 wherein the second form of electromagnetic radiation applied in exposing step g. is an electron beam.

12. The method recited by claim 11 wherein exposing step g. uses an electron beam accelerating voltage of no greater than 30 KV.

13. The method recited by claim 11 wherein the applied electron beam is applied in exposing step g. at a dosage sufficient to cause the uppermost region of the resist layer to become cross-linked.

14. The method recited by claim 2 further including the step of forming a layer of metal over the resist layer, and over exposed portions of the substrate, following step h.

15. The method recited by claim 14 further including the step of stripping any remaining resist off of the upper surface of the substrate after forming the metal layer over the resist layer.

* * * * *